United States Patent
Ibenthal

Patent Number: 5,481,582
Date of Patent: Jan. 2, 1996

[54] RAPIDLY RESETTABLE COUNTING DEVICE

[75] Inventor: Achim Ibenthal, Elmshorn, Germany

[73] Assignee: U.S. Philips Corporation, New York, N.Y.

[21] Appl. No.: 437,247

[22] Filed: May 8, 1995

Related U.S. Application Data

[63] Continuation of Ser. No. 203,167, Feb. 28, 1994, abandoned.

[30] Foreign Application Priority Data

Apr. 17, 1993 [DE] Germany ............... 43 12 561.1

[51] Int. Cl.⁶ .................................................. H03K 21/38
[52] U.S. Cl. .............................. 377/107; 377/54; 377/49
[58] Field of Search ........................... 377/54, 107, 55, 377/56, 49

[56] References Cited

U.S. PATENT DOCUMENTS

| | | | |
|---|---|---|---|
| 4,467,319 | 8/1984 | Uchikoshi | 377/107 |
| 5,117,443 | 5/1992 | Shires | 377/107 |
| 5,222,111 | 6/1993 | Muramatsu | 377/54 |
| 5,226,063 | 7/1993 | Higashitsutsumi | 377/107 |

*Primary Examiner*—John S. Heyman
*Attorney, Agent, or Firm*—Brian J. Wieghaus

[57] ABSTRACT

A rapidly resettable counting device is described, which is particularly suitable for use in signal processors and which comprises a counter (1) receiving a clock signal at an input and supplying its output signal to a first register (2) clocked by the clock signal and to a second register (3) clocked by a reset signal, and a summing stage (4) by means of which the output signal of the second clocked register (3) is subtracted from the output signal of the first clocked register (2), which stage supplies the output signal of the counting device.

16 Claims, 2 Drawing Sheets

RAPIDLY RESETTABLE COUNTING DEVICE

This is a continuation of application Ser. No. 08/203,167, filed on Feb. 28, 1994, now abandoned.

BACKGROUND OF THE INVENTION

The invention relates to a rapidly resettable counting device comprising a counter which is clocked by a clock signal.

There are many uses requiring accurately clocked counters capable of resetting rapidly, i.e. counters which after a reset operation proceed with counting upon the next clock pulse. Such counters are required, for example, for processing digital television signals, or for digital signal processors.

In known digital signal processors the counting devices generally require a latency time of several clock periods. Consequently, a reset operation will take effect only after several clock pulses. This problem can be circumvented by arranging a plurality of slow sub-counters in parallel, which counters operate at one $n^{th}$ of the clock frequency, n being the number of sub-counters. However, it is then difficult and therefore expensive to achieve that the sub-counters are reset with the correct time and phase relationship.

It is an object of the invention to provide a rapidly resettable counting device which does not have these problems.

SUMMARY OF THE INVENTION

For a rapidly resettable counting device in accordance with the invention, this object is achieved in that the device comprises (i) a counter receiving a clock signal at an input and supplying its output signal to a first register clocked by the clock signal and to a second register clocked by a reset signal, and (ii) a summing stage by which the output signal of the second clocked register is subtracted from the output signal of the first clocked register, which stage supplies the output signal of the counting device.

In this counting device the counter itself no longer has to be reset. Instead, the value on the output of the counter is loaded into the second register when the reset signal occurs. Upon the next clock pulse the output signal of the second register is subtracted from that of the first register. Upon this clock pulse the output signal of the counting device, i.e. the output signal of the summing stage, starts again with zero and has thus been reset.

This process repeats itself each time that a new reset signal appears, which resets the output signal upon the next clock pulse.

In this way resetting is effected between two clock pulses, enabling the counting process to proceed without being disturbed and without any problems being caused by resetting.

In an embodiment of the invention the counter may be constructed as a modulo-m counter. The counter itself then counts in cycles of m clock pulses. This does not affect the reset operation by means of the two registers, so that the rapidly resettable counting device can also be used with such modulo-m counters.

For comparatively high clock frequencies one counter may not be adequate, in which case a plurality of sub-counters are arranged in parallel. In accordance with the invention, the counter then comprises a plurality of parallel-connected sub-counters to which the clock signal divided by the number of sub-counters is applied, which sub-counters operate each shifted by one clock period and the output signals of said sub-counters are combined by means of a multiplexer.

The individual sub-counters may then be slower because they have to operate at only one $n^{th}$ of the clock frequency. With this arrangement the reset process for the rapidly resettable counting device in accordance with the invention does not change, the two registers being arranged after the multiplexer.

In accordance with a further embodiment it may be advantageous to use the counting device in accordance with the invention in a signal processor.

The device in accordance with the invention is very suitable, for example, for detecting the position of a pixel of a picture line of a digital television signal because it can be reset rapidly at the beginning of each new picture line without the counting process being interrupted or disturbed. This ensures a reliable detection of the line position in spite of the previously effected reset operation.

BRIEF DESCRIPTION OF THE DRAWINGS

Two exemplary embodiments of the invention will now be described in more detail with reference to the drawing. In the drawing.

DESCRIPTION OF THE PREFERRED EMBODIMENTS

Figure 1:
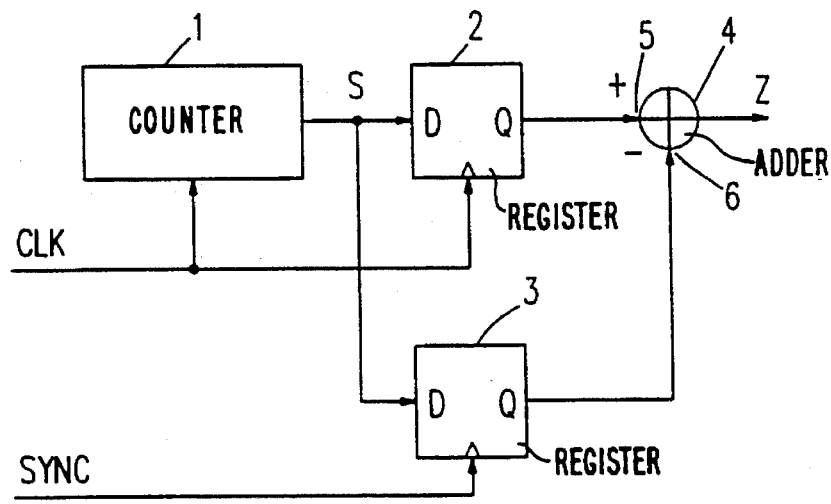
FIG. 1 shows a rapidly resettable counting device comprising one counter.

FIG. 1 is a block diagram of a first embodiment of the rapidly resettable counting device comprising a counter 1 having an input to which a clock signal CLK is applied. The output signal of the counter 1, referenced S in FIG. 1, is applied to a first register 2 clocked with the clock signal CLK and a second register 3 clocked with a reset signal SYNC.

Figure 3:
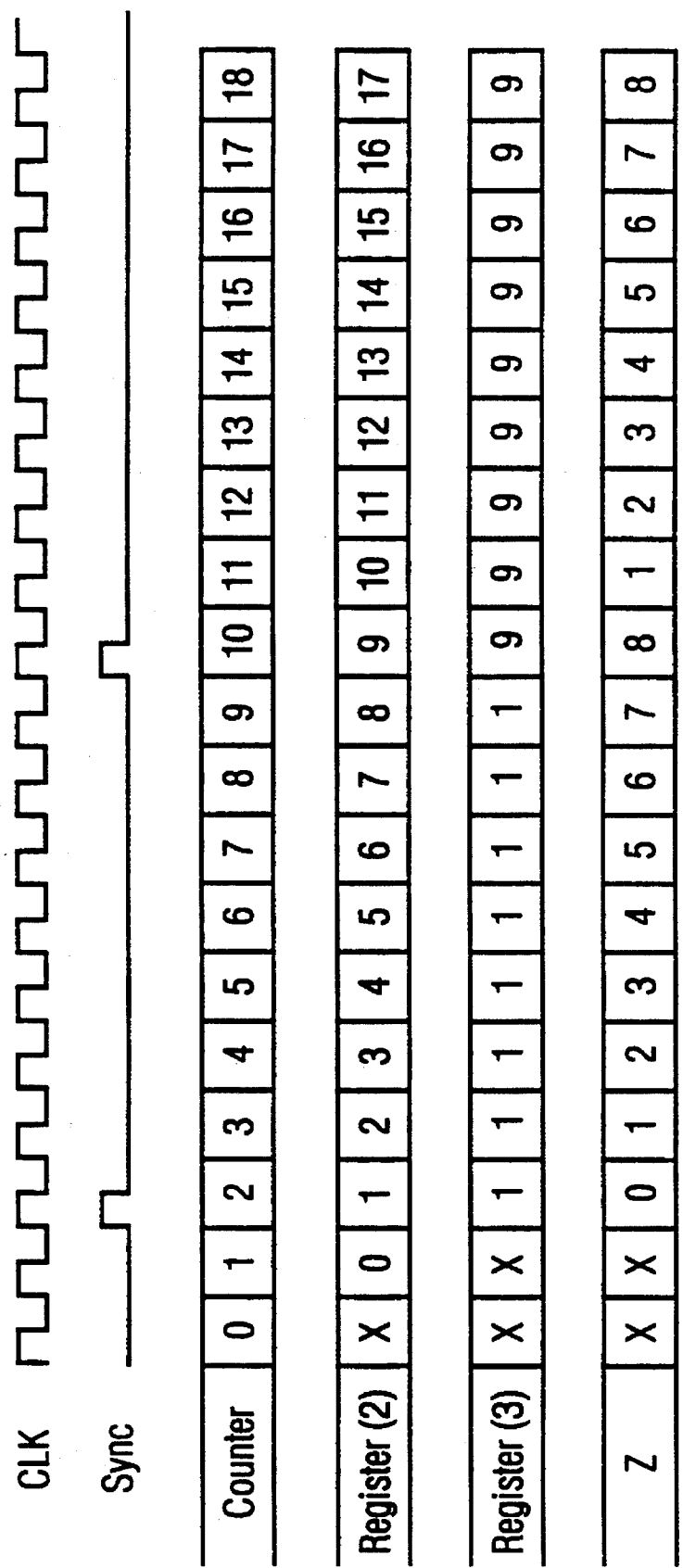
FIG. 3 is a timing chart illustrating the operation of the counting device of FIG. 1.

The registers 2 and 3 are followed by a summing stage, which may be an adder or a subtracter. The embodiment shown in FIG. 1 comprises an adder 4 having a non-inverting input 5 and an inverting input 6. The output signal of the register 2 is applied to the non-inverting input 5 and the output signal of the register 3 is applied to the inverting input 6. FIG. 3 is a timing diagram illustrating the operation of the device in FIG. 1, and in particular, the relative timing of the CLK and SYNC signals, and the outputs of the counter, registers 2, 3 and adder 4. The output of the counter corresponds to the occurrence of the CLK signals.

During the normal counting process the output value previously appearing on the output of the counter 1 is loaded into the register 2 upon each clock pulse CLK and is supplied to the output of the counting device v/a the summing stage 4.

With the first reset operation, which is started by means of a pulse of the reset signal SYNC, the value of the output signal of the counter 1 is loaded into the register 3. Subsequently, this value appears on the output of the register 3 and, consequently, also on the inverting input 6 of the summing stage 4. Because of the clocking action, the output of the counter corresponding to a clock pulse n appears at the output of register 2 on the next (n+1) clock pulse. (See FIG.

3) The output of the counter corresponding to the next previous clock pulse appears at the output of register 3 on the occurrence of a SYNC signal and remains at that value until the occurrence of the next SYNC signal.

The summing stage 4 decrements all the subsequent values of the counter 1, and hence also the output values of the first register 2, by the value stored in the register 3. This means that the output signal of the register 3 is subtracted from the output signal of the register, 2. Thus, the output signal of the summing stage 4, which also constitutes the output signal Z of the entire counting device, again begins with zero. Each time that a reset pulse of the reset signal SYNC occurs the register 3 is loaded with a count which is subtracted from the subsequent counts, so that the output signal of the counting device is reset to zero after each reset operation. The summing stage 4 is not clocked, so its output is not delayed from a change at its inputs by a full clock pulse, but rather only by a much shorter delay characteristic of such circuits. Thus, upon the occurrence of SYNC signal, the output Z is reset to "0" before the occurrence of another clock pulse.

The counter 1 may be a modulo-m counter. The output signal of the counting device is then also a modulo-m signal which, however, can be reset by a pulse of the reset signal.

Figure 2:
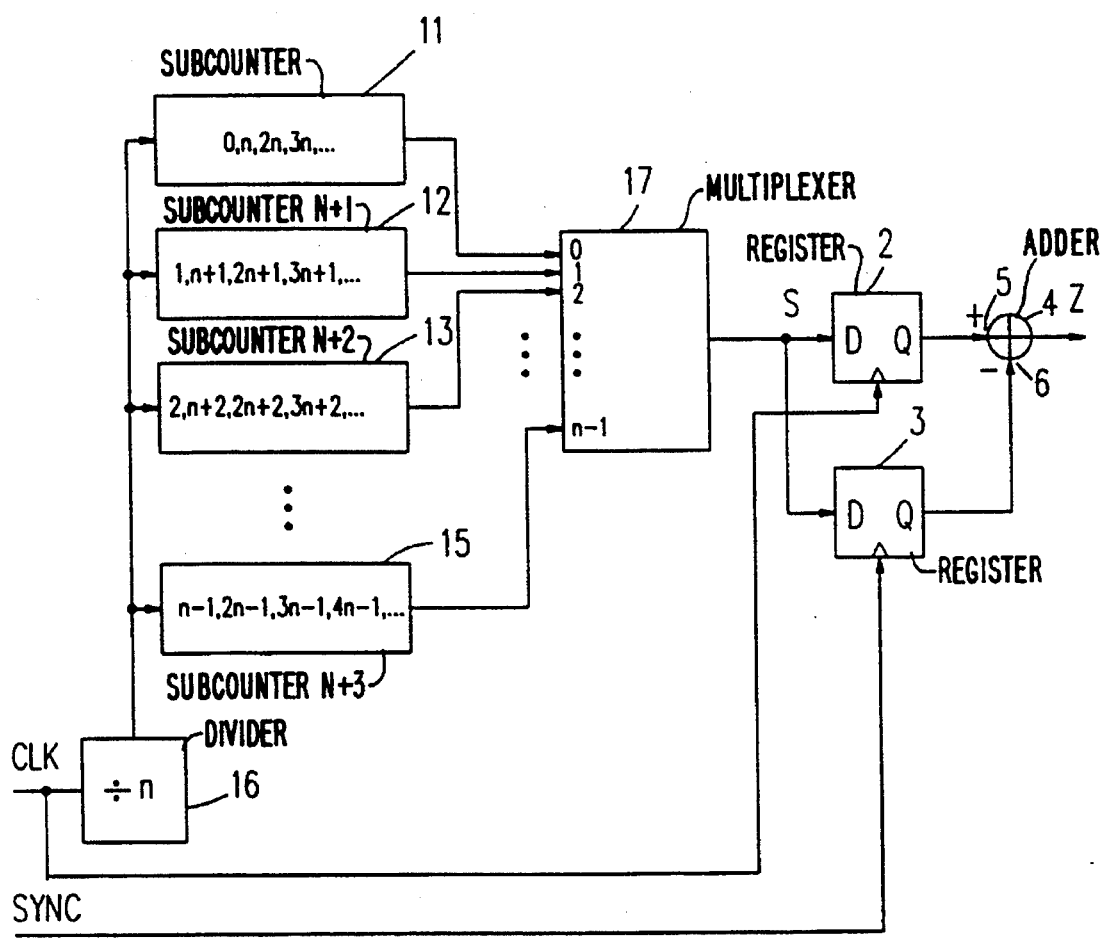
FIG. 2 shows a rapidly resettable counting device whose counter consists of a plurality of sub-counters.

A second embodiment of the invention shown in FIG. 2 also comprises a first register 2, a second register 3 and a summing stage 4 arranged in the same way as the corresponding elements in the device shown in FIG. 1.

However, in the embodiment shown in FIG. 2 the counter 1 of the first embodiment shown in FIG. 1 is formed by a plurality of sub-counters 11, 12, 13 and 15. A divider 16 divides the clock signal CLK by a divisor n, n being equal to the number of sub-counters 11 to 15. If for example four sub-counters are used each sub-counter receives a clock pulse whose clock frequency is a quarter of that of the original clock signal CLK. This device has the advantage that the sub-counters can be slower than the counter 1 in FIG. 1.

The output signals of the sub-counters 11 to 15 of the device shown in FIG. 2 are combined by means of a multiplexer 17.

For such a counting device comprising a plurality of sub-counters resetting is particularly difficult because first of all each counter must be reset individually and, in addition, each counter must be reset with the correct phase, because the counters operate each phase-shifted by one clock period.

The counting device in accordance with the invention is also suitable, without any modification, for such a counter comprising a plurality of sub-counters. FIG. 2 shows that the two registers 2 and 3 and the summing stage 4 are arranged after the output of the multiplexer 17. The operation of these circuit elements is similar to those in the circuit arrangement shown in FIG. 1.

Counting devices as shown in FIGS. 1 and 2 can be used advantageously in, for example, digital signal processors. They may be used, for example, for processing digital television signals, in which case these counting devices can be used for the detection of the line position of a pixel within a picture line of such a television signal. The counter 1 or the sub-counters 11 to 15 then count tier example the rate at which new pixels occur. The counting devices are reset by means of a signal generated at the beginning of a picture line, which signal can be derived, for example, from the horizontal synchronisation signal. Particularly for this purpose it is of great advantage that the counting process is not disturbed by resetting and, consequently, a reliable detection of the position of such a pixel of a picture line is possible independently of the reset operation.

I claim:

1. A rapidly resettable counting device, comprising:
   a) a counter for counting clock pulses in a clock signal, said counter outputting an updated sum of the clock pulses counted upon the occurrence of each clock pulse;
   c) a first register clocked by said clock signal for storing the updated sum from said counter corresponding to the next previous clock pulse upon the occurrence of each clock pulse;
   d) a second register clocked by a recurrent reset signal for storing the updated sum from said counter corresponding to the next previous clock pulse occurring prior to said reset signal, the updated sum remaining stored in said second register until the occurrence of a subsequent reset signal; and
   f) a subtraction device clocked by said clock signal for subtracting the sum in the second register from the sum in the first register upon the occurrence of each clock pulse, the result of said subtraction being the output of said counting device, whereby (i) on the next clock pulse after a reset signal the sum in the second register and the sum in the first register are equal and (ii) the output of said clocking device is reset in one clock signal without resetting of said counter.

2. A counting device as claimed in claim 1, characterized in that the counter is a modulo-m counter.

3. A counting device as claimed in claim 2, characterised in that the counter comprises a plurality of parallel-connected sub-counters, and the counting device further comprises dividing means for dividing the clock signal by the number of sub-counters and for applying the divided clock signal to each of the sub-counters, which sub-counters operate each shifted by one clock period, and a multiplexer for combining the output signals of said sub-counters.

4. The use of a counting device as claimed in claim 3 in a signal processor.

5. The use of a counting device as claimed in claim 3 in a signal processor, for detecting the position of a pixel of a picture signal of a digital television signal within a picture line, the reset signal indicating the beginning of the picture line.

6. A counting device as claimed in claim 1, characterised in that the counter comprises a plurality of parallel-connected sub-counters, and the counting device further comprises dividing means for dividing the clock signal by the number of sub-counters and for applying the divided clock signal to each of the sub-counters, which sub-counters operate each shifted by one clock period, and a multiplexer for combining the output signals of said sub-counters.

7. The use of a counting device as claimed in claim 6 in a signal processor.

8. The use of a counting device as claimed in claim 6 in a signal processor, for detecting the position of a pixel of a picture signal of a digital television signal within a picture line, the reset signal indicating the beginning of the picture line.

9. The use of a counting device as claimed in claim 2 in a signal processor.

10. The use of a counting device as claimed in claim 2 in a signal processor, for detecting the position of a pixel of a picture signal of a digital television signal within a picture line, the reset signal indicating the beginning of the picture line.

11. The use of a counting device as claimed in claim 1 in a signal processor.

12. The use of a counting device as claimed in claim 1 in a signal processor, for detecting the position of a pixel of a picture signal of a digital television signal within a picture line, the reset signal indicating the beginning of the picture line.

13. A method of providing a reset for a counter, which reset is faster than the latency time of the counter employed, said method comprising the steps of:
   a) providing a count signal with count pulses to be counted;
   b) counting said count pulses with a counter having a predetermined reset latency time of at least several count pulses, said counter outputting the sum of the count pulses counted upon each count pulse;
   c) storing the sum from said counter corresponding to the next previous clock pulse in a first store upon each count pulse;
   d) providing a reset signal;
   e) upon each reset signal, storing in a second store the sum from said counter corresponding to the next previous count pulse occurring prior to said reset signal; and
   f) subtracting the sum in the second store from the sum in the first store upon each count pulse and outputting the result as the output of the counter, whereby on the next count pulse after a reset signal the sum in the second store and the sum in the first store are the same and the result of said subtraction is zero.

14. A method according to claim 13, wherein said count pulses are pulses representing the occurrence of each new pixel in a digital television picture signal, and said reset signal is generated at the beginning of each new picture line in the digital television picture signal, whereby the result of said subtraction represents the location of a new pixel within the new picture line.

15. A method according to claim 14, wherein said reset signal is derived from a horizontal synchronization signal in the digital television picture signal.

16. A counting device including a reset for a counter having a reset latency time, the counting device having an output with a reset faster than the reset latency time of the counter, said counting device comprising:
   a) a counter for counting count pulses in a count signal, said counter having a predetermined reset latency time of at least several count pulses, said counter outputting an updated sum of the count pulses counted upon the occurrence of each count pulse;
   c) a first store for storing the updated sum from said counter corresponding to the next previous clock pulse upon the occurrence of each count pulse;
   d) a second store responsive to a recurrent reset signal for storing the updated sum from said counter corresponding to the next previous count pulse occurring prior to said reset signal, the updated sum remaining stored in said second store until the occurrence of the next reset signal; and
   f) a subtraction device for subtracting the sum in the second store from the sum in the first store upon the occurrence of each count pulse, the result of said subtraction being the output of said counting device, whereby (i) on the next count pulse after a reset signal the sum in the second store and the sum in the first store are equal and (ii) the output of said counting device is reset in one count signal, which is faster the reset latency time of the counter.

* * * * *